(12) United States Patent
Tetelbaum et al.

(10) Patent No.: US 6,594,805 B1
(45) Date of Patent: Jul. 15, 2003

(54) INTEGRATED DESIGN SYSTEM AND METHOD FOR REDUCING AND AVOIDING CROSSTALK

(75) Inventors: Alexander Tetelbaum, Hayward, CA (US); Maad A. Al-Dabagh, Sunnyvale, CA (US); Tammy T. Huang, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/986,912

(22) Filed: Nov. 13, 2001

(51) Int. Cl.⁷ .............................................. G06F 17/50
(52) U.S. Cl. ...................... 716/5; 716/6; 716/8; 716/1; 716/4; 716/18
(58) Field of Search ........................................ 716/1–21

(56) References Cited

U.S. PATENT DOCUMENTS

| 5,987,241 | A | * | 11/1999 | Goldberg et al. | ............. | 716/14 |
|---|---|---|---|---|---|---|
| 6,189,131 | B1 | * | 2/2001 | Graef et al. | .................... | 716/8 |
| 6,378,115 | B1 | * | 4/2002 | Sakurai | ......................... | 716/7 |
| 6,449,753 | B1 | * | 9/2002 | Aingaran et al. | ............... | 716/5 |
| 6,467,074 | B1 | * | 10/2002 | Katsioulas et al. | ........... | 716/17 |
| 2002/0038448 | A1 | * | 3/2002 | Ichimiya et al. | ................ | 716/8 |
| 2002/0046389 | A1 | * | 4/2002 | Hirakimoto et al. | ........... | 716/8 |
| 2002/0124230 | A1 | * | 9/2002 | Cai et al. | ........................ | 716/6 |

* cited by examiner

Primary Examiner—Matthew Smith
Assistant Examiner—Magid Y Dimyan
(74) Attorney, Agent, or Firm—Fitch, Even, Tabin & Flannery

(57) ABSTRACT

A system, method and program for hierarchically designing integrated circuits(ICs). Potential sources of crosstalk are identified in the hierachical design and prior to and during placement and wiring while maintaining the hierachical structure. Blocks are placed and analyzed to determine if all blocks are well behaved and where necessary selectively re-organized to be well behaved. Blockages are inserted blocks to restrict top level wiring to avoid crosstalk. Orthogonal restrictions are placed on top level wiring as well as on top level wire lengths.

29 Claims, 12 Drawing Sheets

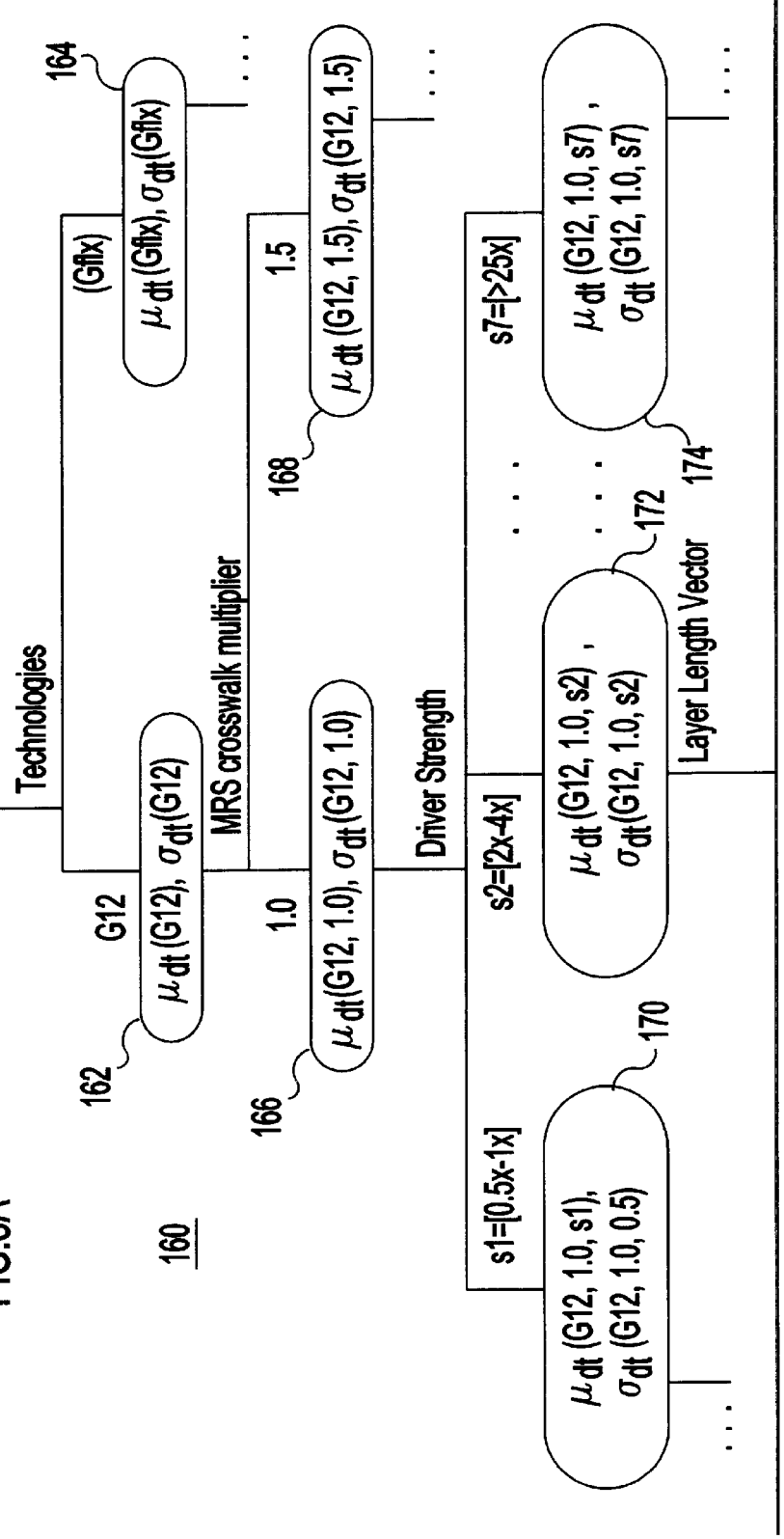

INTEGRATED DESIGN SYSTEM AND METHOD FOR REDUCING AND AVOIDING CROSSTALK

RELATED APPLICATIONS

The present application is related to U.S. patent applicationn Ser. No. 09/968,009 entitled "AN INTEGRATED CIRCUIT DESIGN SYSTEM AND METHOD FOR REDUCING AND AVOIDING CROSSTALK" and to U.S. patent applicationn Ser. No. 09/968,008 entitled "AN INTEGRATED CIRCUIT DESIGN SYSTEM AND METHOD FOR REDUCING AND AVOIDING CROSSTALK" both to M. Al-Dabagh et al., both filed Oct. 2, 2001 and assigned to the assignee of the present invention.

BACKGROUND OF THE INVENTION

1. Field of the Invention

The present invention is related to noise avoidance in logic design and more particularly to reducing noise in integrated circuit logic chip designs.

2. Background Description

Noise problems caused by cross coupling effects (crosstalk) from runs of parallel integrated circuit wires are well known in the art, especially for application specific integrated circuits (ASICs) designed in technologies based at 0.18 micrometers (microns) and below. Crosstalk can result in incorrect logic responses and, in the extreme, chip failure. Accordingly to identify potential crosstalk, circuit analysis tools such as GateScope™ from Moscape, Inc. have been developed.

However, typically, these state of the art crosstalk analysis programs identify crosstalk errors only after circuit cell placement and wiring has been completed. At this point in the design, once crosstalk problems are identified, correcting crosstalk problems may require significant effort, e.g., re-placing cells and rewiring circuits or re-buffering individual clocks and perhaps even redesigning the logic to split affected nodes. Accordingly these prior approaches are time consuming and still may not lead to an acceptable chip design in a reasonable period of time.

Thus, there is a need for identifying potential crosstalk in integrated circuit designs.

SUMMARY OF THE INVENTION

The present invention is a system, method and program product for designing integrated circuits. Potential sources of crosstalk are identified in the hierarchical design and prior to and during placement and wiring while maintaining the hierarchical structure. Blocks are placed and analyzed to determine if all blocks are well behaved and where necessary selectively re-organized to be well behaved. Blockages are inserted blocks to restrict top level wiring to avoid crosstalk. Orthogonal restrictions are placed on top level wiring as well as on top level wire lengths.

It is a purpose of the present invention to eliminate crosstalk from hierarchically architected integrated circuit chips;

It is another purpose of the present invention to identify potential sources of crosstalk in a hierarchical design while maintaining the hierarchical structure and prior to placement and wiring;

It is yet another purpose of the present invention to reduce the number of placement and wiring iterations required in hierarchically architected integrated circuit designs.

BRIEF DESCRIPTION OF THE DRAWINGS

The present invention is illustrated by way of example and not limitation the accompanying figures in which like references indicate similar elements and which

DESCRIPTION OF PREFERRED EMBODIMENTS

Figure 1:
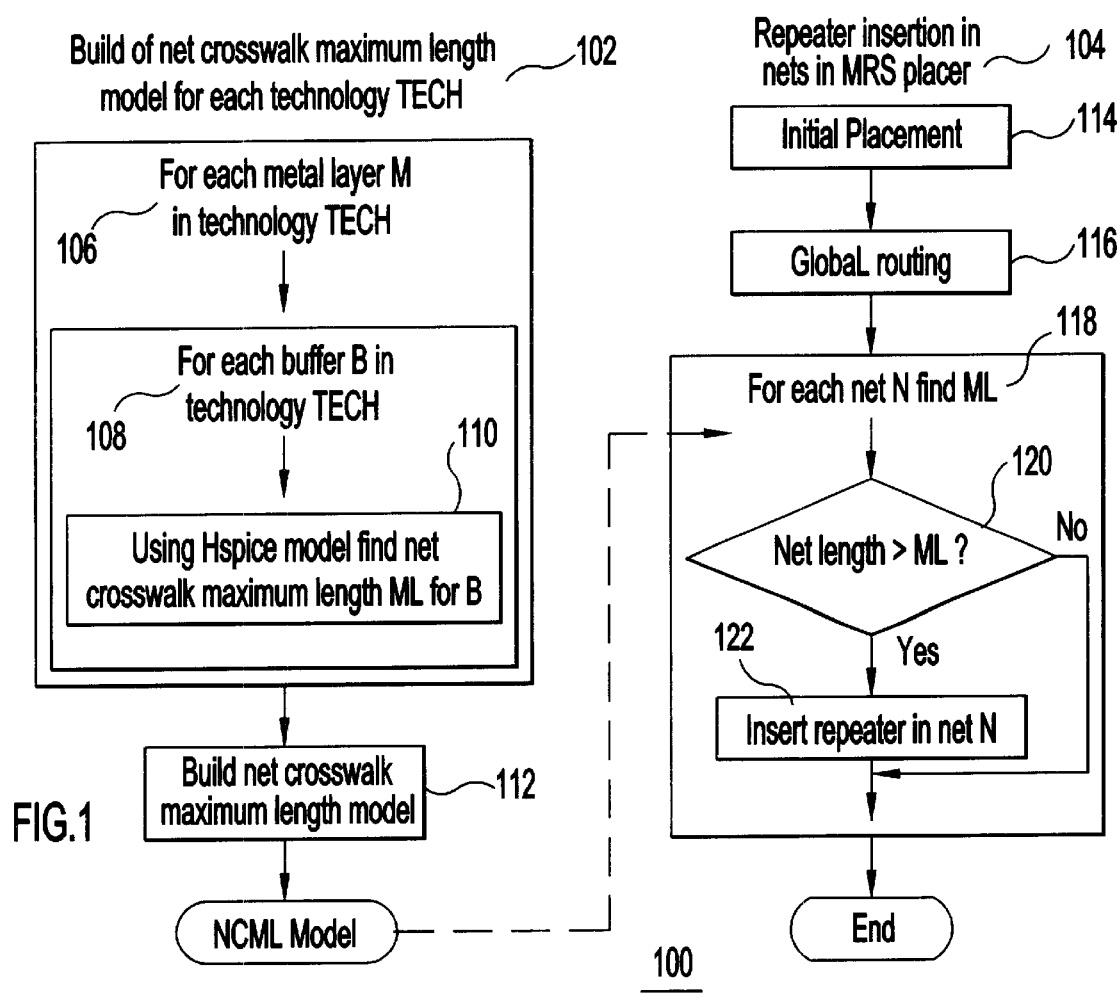
FIG. 1 is a flow diagram of an initial crosstalk reduction step of the preferred embodiment of the present invention.

Turning now to the drawings and, more particularly, FIG. 1 is a flow diagram of an initial or coarse crosstalk reduction step 100 of the preferred embodiment of the present invention. This global crosstalk reduction step includes two major steps. The first major step 102 is a predesign phase or step, wherein wires are characterized for a particular technology to determine a critical length for wires at each layer. The second major step 104 is a segmentation step wherein, after placement, repeaters or buffers are inserted into any nets that have a total wire length greater than a technology defined critical length prior to cell wiring, thereby heading off any crosstalk that might otherwise occur.

So, first, a net crosstalk maximum length (NCML) model is generated in step 102 from existing designs. For each cell in each design a given crosstalk delay uncertainty (CDU) is assumed, e.g., 100 picoseconds (100 ps). The CDU is selected to be maintained within a specified design margin, for a particular cell library, in the particular technology selected. The NCML model is generated using worst case power, worst case voltage and worst case temperature, as applied to the situation wherein two aggressor nets (nets inducing noise into the net being analyzed) run parallel to the victim (the net being analyzed). Using the well known principle of superposition, wires are alternately victims (e.g., when being analyzed for NCML) and, otherwise, aggressor. Further, during this analysis the victim net is taken to switch simultaneously with only one aggressor. Iteratively considering every cell in the cell library, a maximum length is characterized depending on the fan out of the net and the metal loading of the net, as defined by the net length and cell drive.

Thus, in first step 102 for each design being analyzed, each metal layer is selected for characterization in step 106. Next, in step 108 buffer instances are identified for the design. Then, in step 110 the net crosstalk maximum length is identified for that buffer. In step 112 the net crosstalk maximum length model is generated for that technology and is a function that relates wire critical length to cell output resistance as described hereinbelow.

After the net crosstalk maximum length model is generated for a particular technology, it may be applied to nets in new designs in segmentation step 104. So, in step 114 an initial placement is made for a new design. Continuing to step 116 a global wiring routing is done for that initial placement to find a coarse locational relationship between cells in the same nets. In step 118 a maximum length is generated for each routed net using the NCML model. In step 120 each net is checked to determine if it exceeds the maximum length for that net. Any net exceeding the maximum length is segmented and a repeater is inserted between net segments in step 122. After inserting repeaters, the likelihood of crosstalk has been significantly reduced and wiring may continue as normal.

Figure 2:
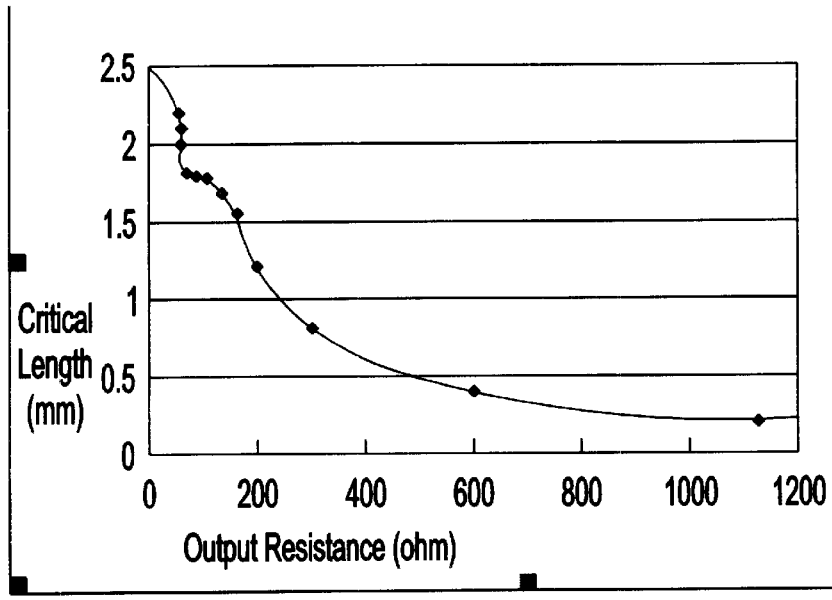
FIG. 2 is a graph showing comparison of cell output driver output resistance verses critical wire length.

FIG. 2 is a graph showing the critical length of wires as a function of output resistance (which is technology dependent) for the cell driving the wire.

Since drive transconductance for a driver is represented by $$\frac{1}{R_{out}},$$

where $R_{out}$ is the output resistance exhibited by the driver cell, the cell output resistance is an indication of drive strength for the cell. Thus, output resistance corresponds to an acceptable maximum net length, i.e., an upper limit to the distance between cells on the same net. Additionally, critical length is technology dependent and, more particularly, in any technology critical length depends upon the wiring layers for the particular wire. Thus, a wire on a second level of metal which has a narrow pitch may have a shorter critical length, e.g., 2.4 millimeters, than a wire on an upper level of metal, such as a fourth level of metal which has a wider pitch and so, may have a critical length of 4 millimeters.

Therefore, the relationship between the output resistance and the maximum length (ML) for a net may be described by the relationship $$ML = \frac{1}{f(R_{out})}.$$

In particular, $f(R_{out})$ may have the form of a simple linear equation to a close approximation, i.e., $f(R_{out}) = a \times R_{out} + b$ and, therefore, $$ML \cong \frac{1}{aR_{out} + b}.$$

Table 1 below shows a comparison example of coefficient a and offset constant b for both wires on a second layer of metal (M2) and on a fourth layer of metal (M4), each being driven by a cell having a drive resistance of 65Ω. The maximum length for a wire entirely on M2, for the example of Table 1, is 2.4 millimeters and, 4 millimeters for M4. Accordingly, the ML may be determined for a given driver driving a wire on any selected level or combination thereof using the above relationship in combination with an appropriate technology table, such as Table 1. Then, for a rough cut, nets that exceed the maximum length for a particular layer or, for a combination of layers are segmented and drivers are inserted between the segments to reduce the level of crosstalk in the net segments.

TABLE 1

|  | a | b | ML for buff |
|---|---|---|---|
| M2 | 0.004189 | 0.144669 | 2.4 mm |
| M4 | 0.004371 | 0.0239 | 4 mm |

Thus, having identified any nets that exceed the maximum length, segmenting those nets and inserting repeaters between most segments, crosstalk concerns have been attenuated. Thus, the initial crosstalk reduction step of FIG. 1 provides an excellent first cut to eliminate the majority of crosstalk errors and, in many cases, may be sufficient that running crosstalk analysis tools on a subsequently wired final design does not identify any crosstalk sensitivities. However, there are other ways in which crosstalk still may effect the circuit performance.

Figure 3:
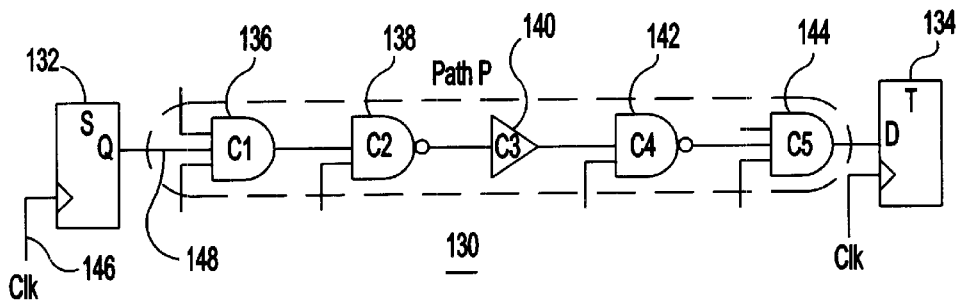
FIG. 3 is an example of a cross-section of a logic path between a starting register and a terminating register.

FIG. 3 is an example of a logic cross-section path 130 between two registers, starting register 132 marked with an S and a terminating register 134 marked with a T. Further, the path 130 includes several cells 136, 138, 140, 142 and 144, representative of logic gates in any typical logic path. Normal circuit design analysis provides propagation delays between the start register 132 and the terminating register 134 based on cell or gate delays (cell input to output) and delays for wiring between the gates. In the absence of crosstalk (the normal design analysis assumption for prior art logic design systems) the propagation delay along path 130 is approximated as a sum of the cell delays and any wiring delays between cells. Thus, path propagation delay can be represented as:

$$D_P = T_{S(Clk,Q)} + \sum_{i=1}^{n} (T_{W(Out_{i-1},In_c)} + T_{C(In_i,Out_i)}) + T_{W(Out_n,D_T)}$$

where $T_{S(Clk,Q)}$ is a delay through register 132 from Clk input 146 to Q output 148; $T_{W(Out_{i-1},In_i)}$ is the wire delay between the output of cell i−1 and the input to cell i; and $T_{C(In_i,Out_i)}$ is the cell delay from input to output of cell i. Normally, design proceeds, placing gates and then wiring the gates after placement.

Figure 4:
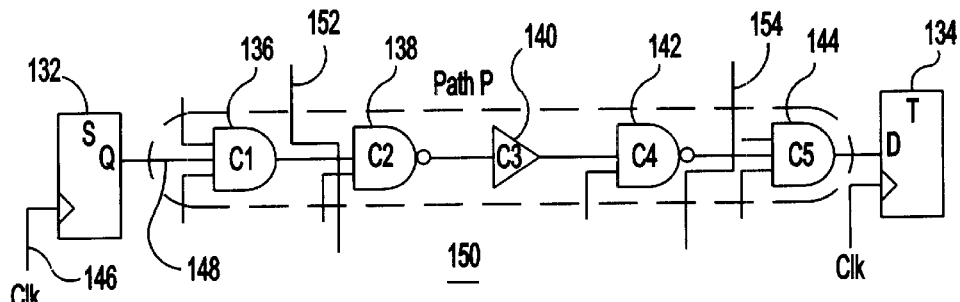
FIG. 4 is an example of the logic cross section with aggressor wires included.

The wired circuit 150 of FIG. 4 is identical to the originally designed circuit 130 of FIG. 3, except aggressor wires 152, 154 have been added during wiring. Wiring analysis is done on a resulting placed and wired circuit such as this. Crosstalk from these aggressor wires 152, 154, may increase or decrease wiring delays $T_w$ in the path by some value (dt) which may be a function of several wire factors, i.e., dt(WireFactor). Each net can be wired through several different available wiring layers. State of the art delay estimation and crosstalk analysis tools calculate pin-to-pin wire delays between cells within the net.

Wiring delays $T_w$ within any path are affected by several wiring factors which also affect crosstalk. Typically, these factors may be categorized to include a technology dependency factor, a driver strength factor, a factor that is representative of the strength of the driver driving the cell (as indicated by the driver resistance or transconductance), the wire's layer lengths on each particular layer, the net fan out, existence of any wires adjacent to the net, and the number of potential aggressors (i.e., the number of adjacent wires). These are all considered in a normal crosstalk evaluation of the wired design. Further, an aggressor coupling ratio is the ratio of total aggressor length to the wire, which is yet another factor. In addition, a crosstalk multiplier may be included to analyze the overall effect of crosstalk on the particular net. This additional crosstalk delay (dt) can be inserted into the above delay equation to result in a more representative relationship:

$$D_P^X = T_{S(Clk,Q)} + \sum_{i=1}^{n} (T_{W(Out_{i-1},In_i)} + dt_i(WireFactors) + T_{C(In_i,Out_i)}) + T_{W(Out_n,D_T)}$$

Where $dt_i$(WireFactors) provides additional crosstalk delay with respect to all of the above mentioned wiring factors. Accordingly, it is understood that if crosstalk acts to reduce delays, crosstalk is not a problem and need not be considered. For the purposes of the present invention, hold time violations (which are relatively simple to correct) are not considered. Therefore, for the worst case scenario crosstalk is taken to increase the path delay, for example, to the point where insufficient time is provided prior to clocking terminating register T. Thus, the delay difference (dD), between an initial design and the final placed and wired circuit is simply the difference between the above two equations, i.e., $$dD = D_P^X - D_P = \sum_{i=1}^{n} dt_i,$$

So, this path crosstalk delay difference dD for any path is a function of the wire factors for the wires within that path and, may vary for each path and for different critical paths. This difference may be characterized for a particular technology from previously established chip designs and, by varying wire factors for each characterized chip design, a mean value for a wire delay adder ($\mu_{dt}$), as well as a standard deviation ($\sigma_{dt}$), may be derived for each particular technology and any particular chip. Further, these chip mean values and standard deviations may be processed statistically to derive an overall mean value and standard deviation for a particular technology which may then be applied to subsequent designs to project expected crosstalk delay on individual nets.

In particular, the path delay may be modeled taking into account a crosstalk delay overhead ($O_p$) on an N cell path. The path delay in the presence of crosstalk can be represented as $$D_P^X = D_P + O_P$$

where the crosstalk delay overhead is $$O_P = \sum_{i=1}^{n} \mu_{dt}(WireFactors) + c \cdot \sqrt{\sum_{i=1}^{n} \sigma_{dt}^2(WireFactors)}$$

where: $\mu_{dt}$(WireFactors) is the mean value of the wire delay addition dt for each wire with respect to wiring factors; $\sigma_{dt}$(WireFactors) is a standard deviation of the value of dt; and, c is the design confidence level. So, for example, c=1 selects the one σ confidence level at 87% confidence, c=2 selects the two σ confidence level at 97% confidence and c=3 selects the three σ confidence level at 99% confidence. Thus, having derived the mean and standard deviation of crosstalk delay additions, delay through each path including crosstalk may be determined with a 99% confidence level for each path.

Thus, crosstalk may be calculated for all nets prior to wiring, and, if necessary, path adjustments may be made to reduce delay through a particular path to maintain critical timing within design constraints for all paths on the same chip. Further, since during the initial design stages, both prior to placement and during placement, most of the wire factors are unknown, e.g., individual net lengths and wire layers used for each net. So, an abbreviated wire factors list may be used for a quick initial delay calculation. For example, for an initial calculation, wire factors may be restricted to driver strength, layer length, fanout, aggressor number and coupling ratio. Also, some wire factors may change during design, e.g., net fanout during resynthesis, driver strength of the net from cell resizing or, even, net length as a result of re-placement or rerouting the net. So, this initial abbreviated list provides sufficiently comprehensive analysis at these initial design stages.

Thus, wiring data statistics may be collected to relate wiring factors to delays for a particular technology and, then periodically, the statistics are updated and maintained for that technology. For this purpose, the collected statistics may include individual net crosstalk delays from a particular design (for example {$dt_1$, $dt_2$, . . .}), the average of those crosstalk delays, as well as the mean crosstalk delay value ($\mu_{dt}$) and standard deviation value $\sigma_{dt}$ which are both functions of wire factors. These delays are binned according to related wire factors and both the tree-like binning structure and the delays are saved for subsequent use and analysis. It should be noted that raw crosstalk delay data, i.e., {$dt_1$, $dt_2$, . . . } may be saved independently of, and separately from the computed wire factor mean and standard deviation values. Thus having computed the mean of the standard deviation values, a statistical representation has been extracted which may be used to predict the expected crosstalk delay for any number of cells or stages between two cells (starting and terminating cells) in any path. Then using these representative values, the crosstalk delay overhead may be predicted for any path of n cells. In particular, prior to placement crosstalk delay overhead is predicted with the simple abbreviated relationship:

$$O_P^S = n \cdot \mu_{dr} + c \cdot \sqrt{n} \cdot \sigma_{dr}.$$

As a result, by considering each wire independently and using chip average WireFactor parameters, a close estimate of the path crosstalk is achieved such that crosstalk is predicted within a desired degree of confidence prior to placement and ring.

Figure 5B:
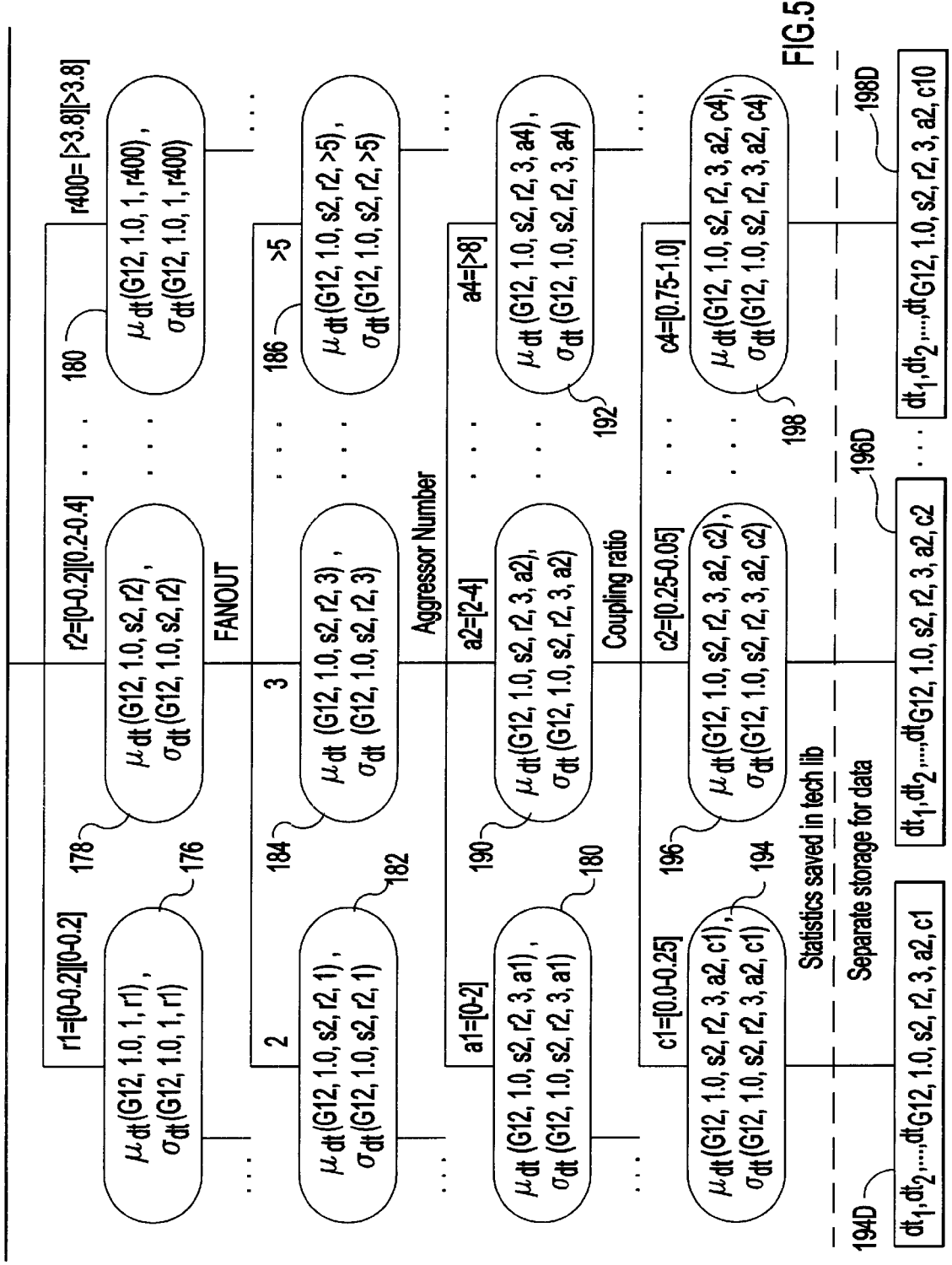
FIG. 5 shows an example of a tree-like classification structure.

FIG. 5 shows an example of a cross-section of the above described tree-like classification structure 160 which may be constructed using the particular wire factors selected. The number of classification bins in the tree-like structure 160 corresponds to the number of wiring factor variables selected and the number of possible results for each of the wiring factors. Thus, for six wiring factors described above, i.e., technology, placement multiplier, buffer strength, layer length, fanout, number of aggressors and coupling factors, the number of bins is the product of each number of possibilities for each of the wire factors and the structure may have the general appearance of the example shown in FIG. 5. Accordingly, by constraining the particular wire factors selected and the granularity within each wire factor the number of bins may be managed to a reasonable number.

For example, the number of technologies may be held to two 162, 164, respectively, labeled G12 and Gflx in this example. Crosstalk multipliers may be constrained to two 166, 168, corresponding to a normal delay (unity) or a relaxed crosstalk delay at a 1.5 multiplier. Seven different buffer strengths may be selected represented by bins 170, 172, 174, corresponding to a minimum buffer strength of 0.5 to 1X, or buffer strength ranges of 2X to 4X, 5X to 8X, 9X to 12X, 11X to 15X, 16X to 25X, and greater than 25X, respectively, to provide for increasing buffer drive depending upon the expected load for a particular net. Layer length vector bins may be selected based on an expected maximum layer length. For example, 81 layer length vector bins represented by bins 176, 178, 180 may be selected to segment an expected maximum length of 4 millimeters, into nine 0.5 mm bins for each of nine individual layer length value ranges. Fanout can be constrained by design, however, fanout bins 182, 184, 186, typically, will cover ranges from one or two up to more than five. Aggressor number range bins 188, 190, 192, typically, can be selected for as many aggressor ranges as are deemed appropriate, such as 0 to 2, 2 to 4, 4 to 6 and more than 6. Coupling ratios which are dependent upon the victim and aggressor wire layers can be constrained to, for example, four coupling ratio bins represented by bins 194, 196, 198, each coupling ratio bin corresponding to one of a range from 0.0 to 0.25, 0.25 to 0.5, 0.5 to 0.75, or 0.75 to 1.0. It is understood that this WireFactor tree and associated wire factors are provided for example only and not intended as a limitation.

So, for this example the number of bins N=2×2×7×81×5×4×4=181,440 bins, (i.e., 2 technologies×2 crosstalk multiplier ranges×7 buffer strength ranges times 81 layer length vector ranges×5 fanout ranges×4 aggressor ranges×4 coupling ranges) a small number by comparison to the number of cases considered by prior art analysis methods. Continuing this example, an average design containing on the order of three million wires, collecting statistics for 10 completed designs provides an average of 150 wires from each design in each of the nearly 200,000 bins and may be considered as representative data. At the bottom of the tree, the crosstalk data 194D, 196D, 198D is grouped for each bin. Each bin 194D, 196D, 198D is defined by walking through the tree to a bottom classification bin.

Figure 6:
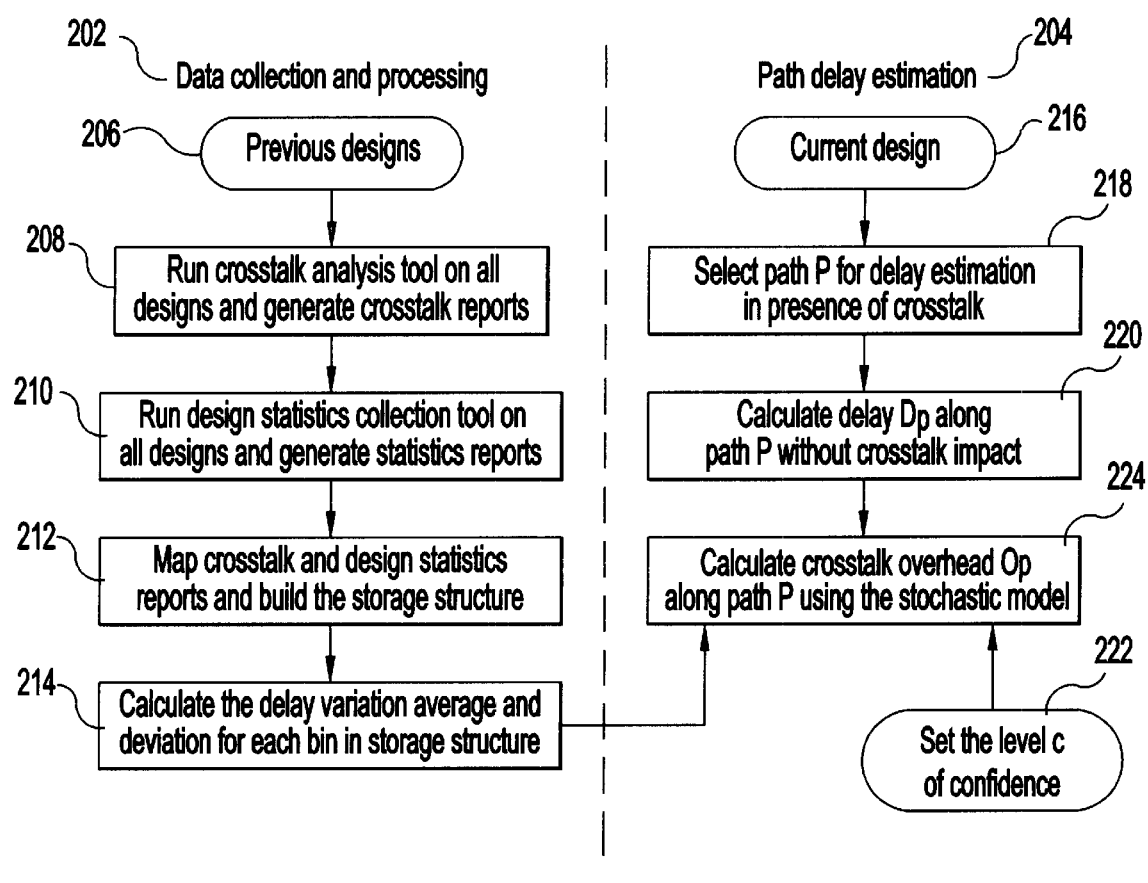
FIG. 6 shows a flow diagram exemplary of a step of generating average per stage crosstalk related delays for a coarse pre-wiring crosstalk analysis model.

FIG. 6 shows a flow diagram 200, exemplary of the this phase of the preferred embodiment of the present invention wherein, average per stage crosstalk related delays are generated in major step 202 and included in the model for subsequent prewiring crosstalk analysis for new designs in step 204. First, in step 206, previous designs in a particular technology are collected. In step 208 crosstalk analysis is conducted on the selected previous designs and crosstalk reports are generated for those designs. In step 210, design statistics are collected from the crosstalk reports and statistics reports are generated. In step 212 the crosstalk and design statistics are mapped to particular bins and the tree-like storage structure is created. In step 214 crosstalk delay mean and standard deviation values are generated for each bin in the storage structure. These mean and standard deviation values are outputs from first major step 202 passed to the second major step 204 for use in subsequent delay calculations. In step 216, a new design is presented for analysis. In step 218 each path of the new design is selected, one by one, and each selected path is analyzed for crosstalk affects. In step 220 the raw delay DP along the path is calculated, i.e., without consideration of crosstalk. In step 222 a statistical crosstalk overhead along the selected path is generated using the mean and standard deviation generated from step 202. The confidence level is set in step 222 and the result is passed to step 224 wherein crosstalk overhead is calculated for the selected path. Based on this initial analysis, potential problems may be identified and the design may be modified to eliminate those errors prior to wiring.

Figure 7:
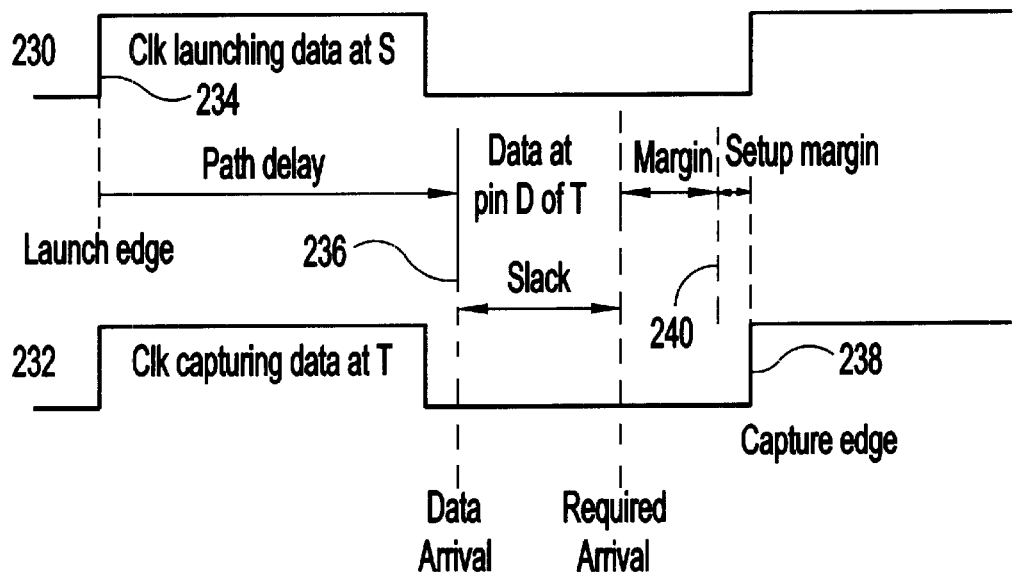
FIG. 7 is an example of a timing diagram for a typical path timing relationship between a start register and a terminal register.

FIG. 7 is a timing diagram showing an example of a typical path timing relationship between a start register 132 and a terminal register 134 as in FIGS. 3 and 4. The start register 132 is set by clock 230 and the terminating register 134 is set by clock 232. Clock launching edge 234 latches data into the start register 132, passing latch data out of the start register 132 to initiate signal propagation through the path P. The signal propagates through the path logic, emerging from the logic at the input pin D of the terminating register 132 at data arrival time 236. Capture edge 238 is the clock edge upon which the path datum latches into the terminating register 134. Typically, each flip flop or register requires a period of time known as the setup margin 240 after which data into the register must be maintained at a constant value in order for the register to latch correctly. Also, typically, designs include a safety margin, some requisite advance data arrival time indicated by dashed line 242, in addition to the setup time at which time, the data path output is required to remain at a constant level. This safety margin is sometimes referred to as design margin and is included to compensate for process, voltage and temperature (PVT) variations, as well as delay variations from crosstalk between nets and further for inaccuracies in design models and process model algorithms. The excess time between the arrival of an input signal from the path at 236 and the required arrival 240 is known as the slack for the particular data path and is different for each path.

Critical paths are those paths where the slack is zero or close to zero for a particular design and may further include paths wherein slack falls below a design minimum for the design. Normally, the design margin is selected to accommodate for uncertainty in the design due to clock edge arrival, power supply voltage variability and for process variations. Setup margin usually is a constant for each particular technology, e.g. 10% of the clock period.

Although normally a design consideration, for purposes of describing the present invention, clock skew is ignored and is treated as zero. Thus, as described herein slack is defined as the required input arrival time (i.e., clock edge-setup margin minus the expected data arrival time and, is never allowed to be less than zero.

For any clock domain within a design, the design margin depends in large part on the particular design technology. If PVT, delay and other design parameter variations require increasing the margins then path delays must also be reduced in order to compensate. So, any change in the margins for one path constrains all paths in the clock domain for the particular technology. For non-critical paths that have a small path delay value and large slack this may be acceptable. However, this tighter constraint is not acceptable in critical paths. Further, some paths that may not be critical prior to slack reduction and may become critical because of the reduced slack.

Accordingly, path crosstalk delays may be considered in early design stages by adjusting design and setup margins during physical design to anticipate likely crosstalk. This minimizes the impact to the finally placed and wired design to within a selected level of confidence or certainty. Thus, running expensive time-consuming design analysis tools after wiring a design is no longer a design requirement because crosstalk design violations have been avoided to within that level of certainty.

So, the setup margin may selectively be changed for any particular register (or flip flop) such as the terminating register 134. For each register, the setup margin may depend upon the technology, the clock domain and the maximum number of cells among all paths ending in that terminating register. By increasing the required register setup margin, the acceptable delay is reduced through all paths ending in that register. However, only those paths that have path delays long enough that the margin becomes insufficient (i.e., slack becomes negative) as a result of this change need be considered for further analysis as requiring timing adjustment or redesign. Typically, shortening either of the setup or design margins places additional constraints on cells within the path or within the paths to the register being considered. Meeting those additional constraints may require, for example, increasing cell power levels in one or more cells. This increased setup margin analysis may be done using a Standard Delay Format (SDF) file for a particular design by introducing an incremental addition to the setup margin for one or more particular flip flops or registers being considered. One present drawback to this approach is that any change in setup margin constrains all paths. However, the preferred embodiment of the present invention more precisely determines the likely delay through any particular path because, individual setup times and margins are assigned to individual registers or flip flops in individual paths.

Figure 8:
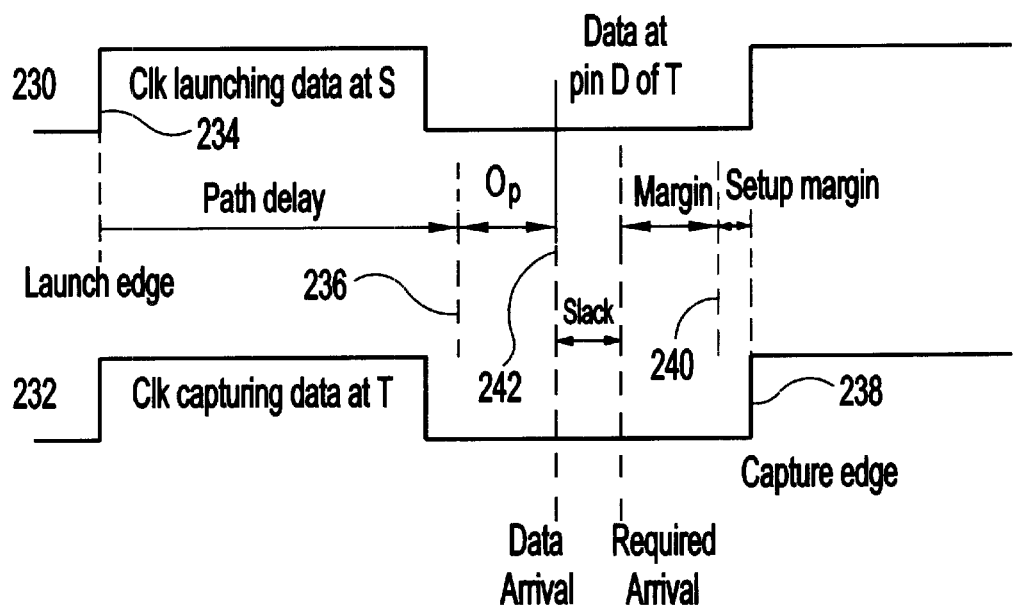
FIG. 8 shows inclusion of crosstalk overhead in path delay analysis for a closer, more accurate arrival time estimate.

First, using the above described method 200 of FIG. 6, a crosstalk overhead is calculated for each path. As represented in FIG. 8, crosstalk overhead can be inserted into the path delay to get a closer more accurate estimate of the actual arrival time and so, a truer estimate of the slack available in each path. This estimate is more accurate because uncertainty is removed by adding more representative crosstalk overhead to the original data arrival edge 236 to provide an updated data arrival edge 242. So, the slack value, may be reduced because crosstalk overhead no longer must be considered as an unknown delay factor, since expected crosstalk is no longer an unknown or an unquantifiable value for the path.

Figure 9:
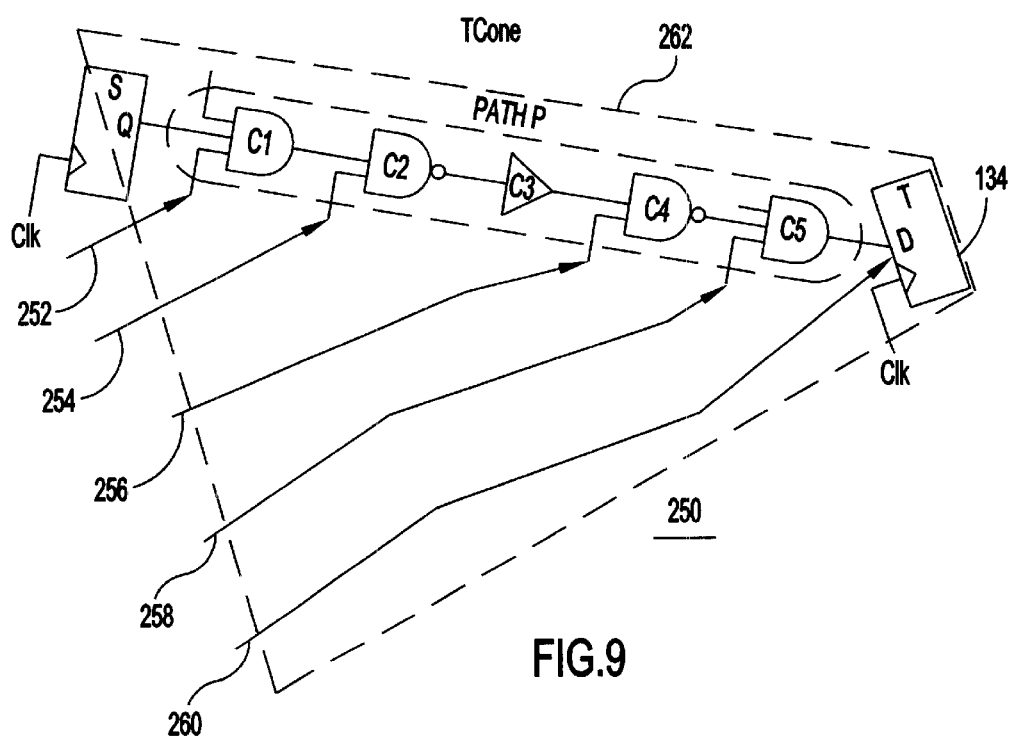
FIG. 9 shows a Tcone path for a terminal register.

FIG. 9 shows a path 250 terminating in terminal register 134, including paths indicated by arrows 252, 254, 256, 258 and 260 that are of various lengths representative of path delays, figuratively referred to as the Tcone 262 of the path. Sensitivity to crosstalk in the path 250 is inversely proportional to the closeness to the terminating register 134 at which the particular Tcone path 252, 254, 256, 258, 260 merges with main path 250. Thus, path 252 is more sensitive to crosstalk than path 254, etc. So, the preferred embodiment crosstalk delay estimator of the present invention determines a delay overhead for each Tcone path to assist in developing a crosstalk delay margin guideline. In particular, each register or flip flop is considered for each clock domain and for each considered register, the longest path terminating in the register is identified. The setup crosstalk overhead for terminating register can be identified using the relationship $$O^S = \max\{O_P^S(n)\} = O_P^S(n_{max})$$

where $n_{max}$ is the largest number of cells in one path of all the paths in the Tcone of the particular register.

Figure 10:
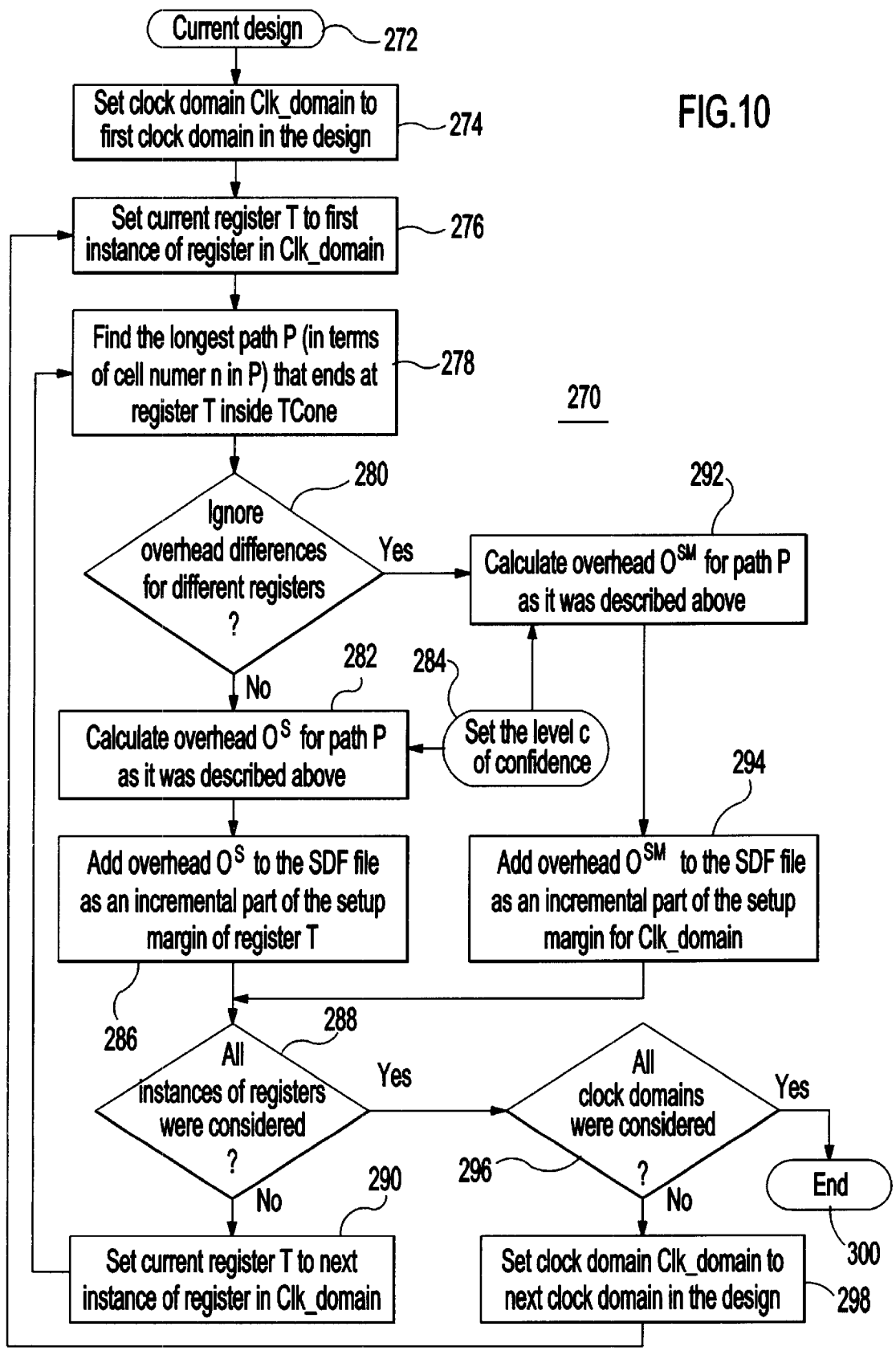
FIG. 10 shows an example of a refinement step for setting and adjusting timing margins for path crosstalk delay analysis.

FIG. 10 shows an example of an additional refinement step 270 for setting and adjusting timing margins of a design according to the present invention. The design is input in step 272. In step 274 the clock domain variable CLK_ domain is set to point to the first clock domain in the design. In step 276 the first instance of a register in the current clock domain is selected as a terminating register. In step 278 traversing back from the terminating register, a Tcone paths is identified. In step 280 a check is made to determine whether the simplified analysis is to be run wherein overhead differences for different registers are to be ignored. If not, continuing to step 282 the crosstalk overhead is calculated for the path using the selected confidence level in 284. Then, in step 286 the calculated overhead is added to the SDF file as an incremental part of the setup margin for the current selected terminating register. In step 288 a check is made to determine whether all instances of registers were considered. If additional registers remain to be considered then in step 290 the next register instance is set as a current terminating register and returning to step 278 that next register is considered. If, in step 280 the simplified margin is indicated such that overhead differences for different registers are to be ignored, then, in step 292 the simplified overhead margin is calculated for the path as described above, using the confidence level from 284. In step 294 that simplified overhead margin is added to the SDF file and provided as an incremental part of the setup margin for registers of the whole clock domain. In step 288 if all instances of registers have been considered, then in step 296 a check is made to determine whether all clock domains have been considered for the design. If not, in step 298 the current clock domain is set to point to the next clock domain and, returning to step 276 the first instance of a register for that clock domain is selected. Once it is determined in step 246 that all clock domains have been considered, then, the design is complete in step 300.

The above described circuit analysis and design methods are directed to crosstalk analysis in flat designs and do not address crosstalk analysis for hierarchical designs. Typically, these hierarchical designs are large complex designs with several separate functional blocks, each wired together with global wiring at the top level of the design.

Accordingly, the preferred embodiment design tool constrains block placement and both block and global or top level wiring in hierarchically architected designs (crosstalk avoidance) such that separate individual blocks maintain a high degree of crosstalk immunity. After both block placement and top level wiring, the design is checked physically for potential crosstalk sources and any that may be found are eliminated. This check is independent for each block and at top level. The preferred embodiment design tool obviates the need for block flattening to the design's top level and top level crosstalk timing analysis on the flattened design, which is often very time consuming, if possible at all for large complex hierarchical designs.

Figure 11:
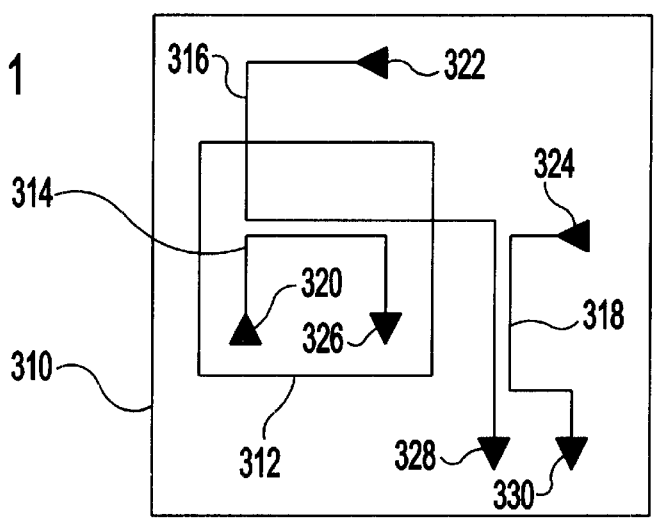
FIG. 11 shows an example of potential sources of crosstalk in a hierarchical layout that are not normally discovered until after chip wiring is completed and the wired chip is flattened, when chip timing is checked.

FIG. 11 shows an example of potential sources of crosstalk in a hierarchical layout that are not normally discovered until after chip wiring is completed and the wired chip is flattened, when chip timing is checked. The top design level (also referred to as chip or global level) is indicated by outer box 310. Box 312 is representative of a hierarchical block. Block net 314 is contained in block 312. Top level nets 316 and 318 are shown with wiring for net 316 passing through block 312. Each individual net 314, 316, 318, is represented as being driven by a first cell 320, 322, 324 and terminated by a corresponding terminating cell 326, 328, 330. In this example, net 314 is a block level aggressor net. Net 316 is a top level victim net that passes through block 312 where it is substantially parallel to block level aggressor net 314. Top level aggressor net 318 includes a run that is substantially parallel and in close proximity to top level victim net 316. Typically, during top level wiring block level aggressor net 314 is invisible to top level victim net 316. Thus, it can be seen that the effect of the block level aggressor net 314 on top level victim net 316 is not necessarily known or contemplated during wiring. Further, crosstalk between nets 314 and 316 normally would not be identified until the hierarchical design is unnested or flattened and timing analysis has been run on the flattened design. Prior art analysis tools are not capable of checking for crosstalk conditions between hierarchy levels, (e.g., block to top level) or checking for block boundary crosstalk conditions, or block to block crosstalk conditions.

Accordingly, the preferred embodiment design tool of the present invention is a two prong approach, of both avoiding and eliminating crosstalk in a hierarchical design. First, the design layout and blocks within the design are constrained to avoid conditions that are potential sources of crosstalk. Second, after placement and wiring, the hierarchical design is rule checked for potential sources of crosstalk. So, blocks are placed, checked and organized to minimize the occurrence of crosstalk effects from top level wiring passing through the blocks in a first major step. Then, in a second major step, top level wiring is routed observing space constraints that reflect block wiring characteristics. Accordingly, hierarchical designs need not be flattened and analyzed to identify crosstalk effects because crosstalk conditions have been avoided and/or potential occurrences have been removed from the hierarchical design itself.

Figure 12:
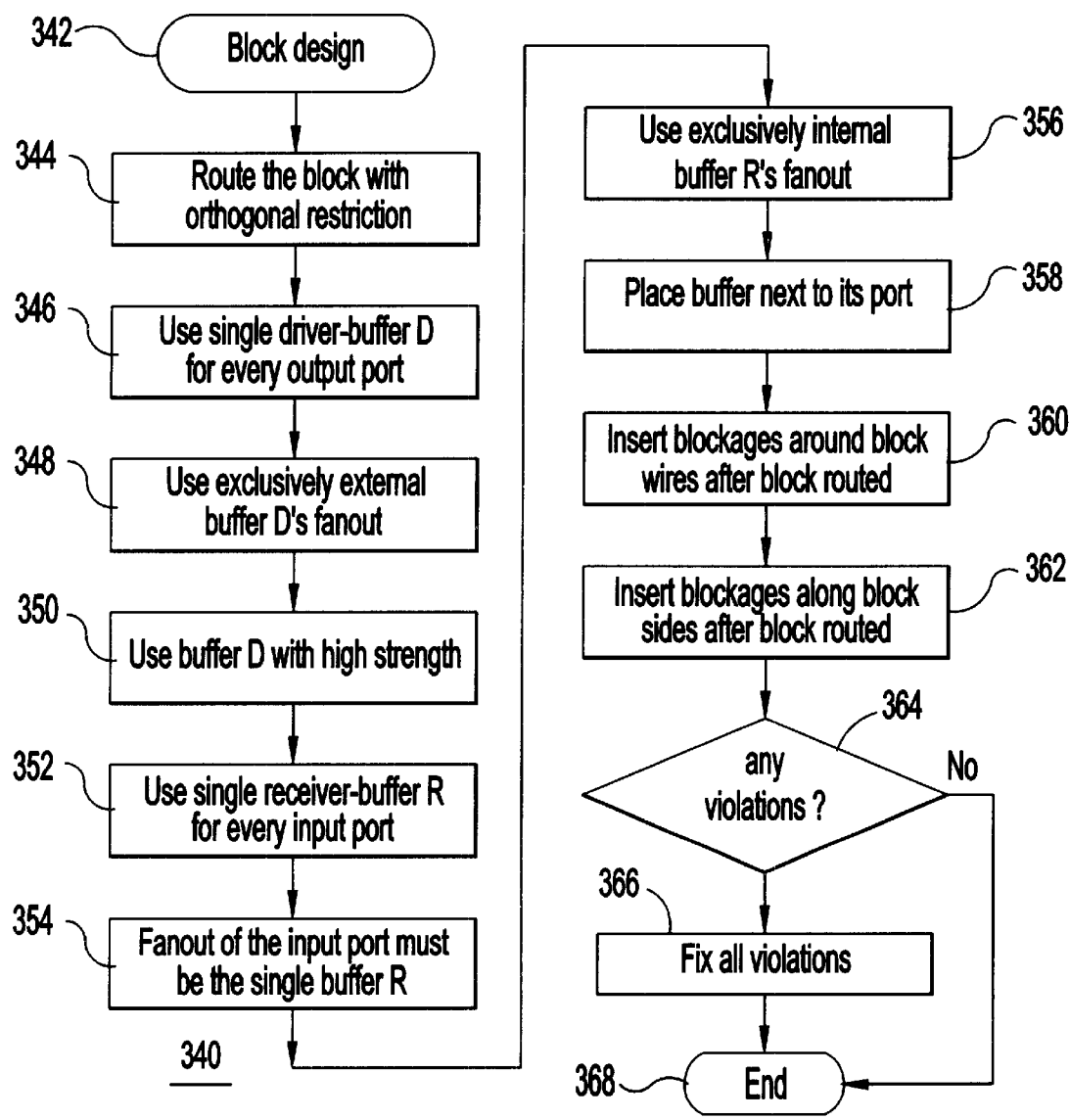
FIG. 12 shows an example of a flow diagram of the preferred embodiment crosstalk management method wherein a stochastic crosstalk model is applied to analyze a design prior to cell placement.

FIG. 12 shows a flow diagram for the first major step 340 of the preferred embodiment design tool. In step 342 a block level design is input, and blocks are placed within the design and checked for conditions that might give rise to crosstalk. In step 344 wiring within the block is checked for orthogonality between metal layer directions. Orthogonal directions are defined for routing top level wiring over each of the blocks. This step 344 assures that in each block adjacent wiring layers are orthogonal. In particular, the lowest metal layer of the top level wiring that passes over each block is constrained to be orthogonal to the uppermost wiring layer of the particular block. As a result, no two wires on two adjacent wiring layers run parallel to each other through any block, at least not for any significant distance.

Next, beginning in step 346, blocks are checked to determine if each well behaved, i.e., all nets to internal block cells are internal nets, external nets to each block only drive buffers and external nets from blocks are external and driven only by buffers. So, in step 346 every block output port is checked to assure that a buffer is driving each. Next in step 348 fanout is checked at all block output ports. Fanout from all output buffers must be external to the block. This step 348 prevents block outputs from driving cells in the block. In step 350 buffer strength is checked to determine whether any is underpowered such that the net it drives, fails the crosstalk critical length criteria and loading guidelines as described above. These criteria and guidelines are stored in corresponding technology file. In step 352, each input port is checked to insure it is buffered with a single input buffer. In step 354 the fanout of each input port is checked to verify that no more than one input buffer is connected to the particular input port. In step 356 input buffers are checked to verify that none drive external nets. Finally in step 358, all port buffers are checked to verify that all are adjacent to block ports. Thus, steps 346 through 358 check each block to determine if all internal nets are contained within the block, block inputs drive input buffers and output drivers drive only external nets at block outputs.

In step 360, to minimize crosstalk between through-wired top level wires passing block level wires, blockages are inserted at block level wires in the routed block. In step 362 to ensure proper spacing between block level and top level wiring in the same layer, blockages are inserted alongside blocks. Any violations of the block level rules from steps 344–362 are noted in step 364. If rule violations are found, then in step 366 the violations are corrected. Of course it is understood that each violation may be corrected as it is encountered in each step 344–364 or, preferably, violations are identified and all identified violations are corrected in step 366. If no violations are found or after all violations have been corrected, then the first phase ends in step 368. At this point, each block is well defined and potential crosstalk conditions should have been removed from block level wiring.

Figure 13:
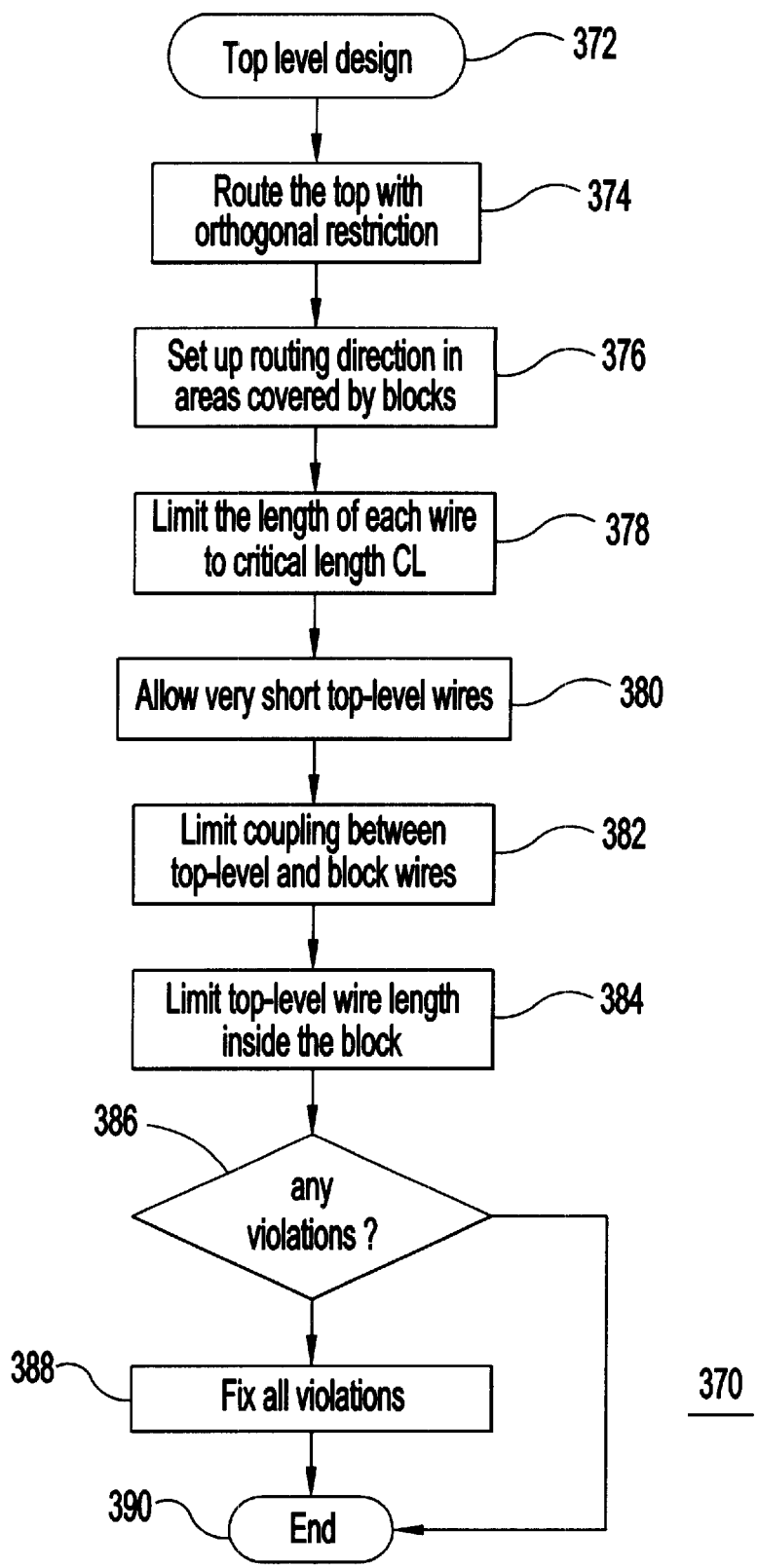
FIG. 13 shows a flow diagram of the second major step, which avoids or eliminates crosstalk from the top level wiring.

Next, FIG. 13 is a flow diagram of the second major step 370, which avoids or eliminates crosstalk from the top level wiring. So, in step 372 the design is provided for top level wiring and in step 374 top level wiring is routed, maintaining orthogonality between the lowest layers of the top level wiring and the uppermost layers, at least, of the block level wiring. Thus, in step 374 the general direction for each metal layer of the top level wiring is set in the hierarchical design. In step 376 a routing direction is set for top level wiring over the blocks. Short runs over the blocks (too short to cause crosstalk) that are non-orthogonal are allowed in step 376 and blocks that have been rotated upon placement are accommodated by setting a different top level orthogonality orientation in such blocks. In step 378 any top level wires that pass through blocks are identified and segmented to avoid exceeding the critical crosstalk length as described hereinabove. In step 380 very short wires, i.e., shorter than a selected threshold length, are ignored, and so, are allowed to deviate from the orthogonality requirement. So, short connections or short runs from which crosstalk may be neglectable are ignored. In step 382 coupling between top level wires and block level wires are checked to identify any long parallel runs that exceed the critical length (CL). In step 384 any top level wires that pass through any block for a distance in excess of CL are identified. In step 386 the results from checking the limitations of steps 374 through 384 are identified are checked for any violations. If violations are found to have occurred then, in step 388 all violations are fixed. Again, it is understood that any violation may be corrected as it is encountered in each step 374–384 or, preferably, violations are identified and all identified violations are corrected in step 388. If no violations exist or, after all violations have been fixed in step 388, the design is complete in step 390.

Having thus described the two major design steps 340, 370 of the preferred embodiment design tool, individual steps are described hereinbelow with examples, where appropriate, and with reference to the corresponding steps of FIGS. 12 and 13.

Figure 14:
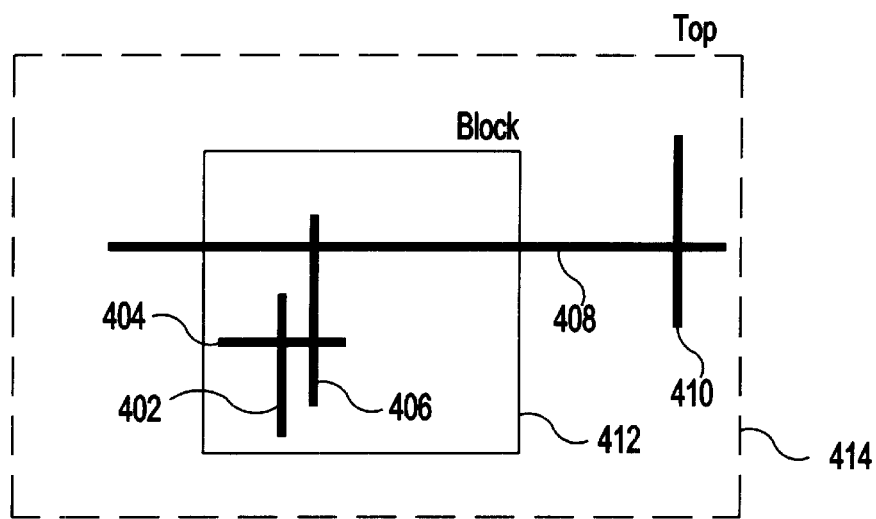
FIG. 14 shows an example of wires routed on different layers.

FIG. 14 is an example of routed wires 402, 404, 406, 408, 410 on different layers. As noted above, both steps 344 and 374 maintain orthogonal metal layer directions for the top level and block level routing. This step 344 or 374 in each of the above described phases minimizes interlayer crosstalk conditions. Wires 402, 404 and 406 are block level wiring in block 412. Wires 408 and 410 are top level wiring in top level design 414. Wires 402 and 408 may be on adjacent layers. Also, wires 408, 410 may be on adjacent layers. In addition, wires 406, 404 and 402 may be on adjacent sequential layers in that order. Capacitance between two wires on different layers is determined by the intersecting area of the two wires, i.e., the common area formed by one wire overlaying the other. Accordingly, by requiring that any two adjacent metal layers have wires routed in orthogonal directions, capacitance is minimized between any two wires on to those adjacent metal layers. This is because the intersection area is minimized for orthogonal wires on adjacent layers. Since capacitance is minimized between wires on adjacent layers, crosstalk is minimized.

It should be noted that this constraint must be followed inside each block, e.g., block 412, inside the top level wiring and between each block and the top level wiring. Blocks that are instantiated into the top level 414 with rotation might otherwise violate this constraint. Very short wires (below some threshold length) may be ignored, allowing these short wires to be oriented in the "wrong" direction for wire routing flexibility. If block level and top level wiring satisfies this constraint, then no significant crosstalk can occur between adjacent wiring layers. Thus, this constraint is applied to all block level wires, all top level wires, and in particular to adjacent layers, the upper layer block level wires (i.e., in the uppermost layer of the blocks) and the lower layer top level wires (i.e., in the lowest metal layer of the top level design wiring).

This first constraint facilitates both crosstalk avoidance (e.g., step 344 in major step 340) and checking (e.g., steps 374, 376 in major step 370). For crosstalk avoidance the direction of the uppermost metal layer of each block is determined. Then, the orientation of the block, as placed in the top level design, is identified to constrain the top level wiring orientation through the block. So, if the block is rotated 90° or 270° and then placed, then the direction of the lowest level of the global or top level wiring through the block is defined as orthogonal to the direction of the uppermost layer of the block wiring. Top level wiring may change directions as it passes through individual blocks, but orthogonality is maintained throughout.

Figure 15A:
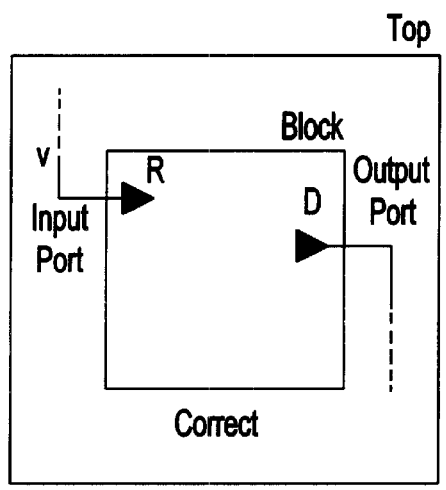
FIG. 15A shows an example of all block ports being buffered to minimize inter-wiring layer crosstalk.
Figure 15B:
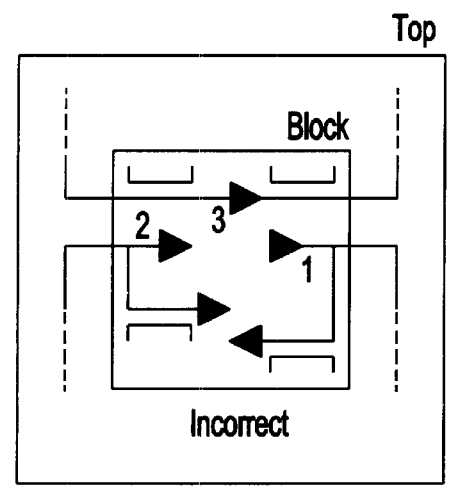
FIG. 15B shows a contrasting example of FIG. 15B illustrating violations of the constraints of port buffering steps.

Once wiring orientation is set to minimize inter-wiring-layer crosstalk, nets within each block (internal nets) are isolated from nets in other blocks (external nets). As a result, all block ports are buffered as can be seen from the example of FIG. 15A. FIG. 15B is a contrasting example showing violations of the constraints of steps 346–358 regarding port buffering. Accordingly, in step 346 of the first phase 340 each block 420, 422 is checked to verify that a single buffer driver is driving each block output port. Thus, FIG. 15A shows a single driver buffer 424 and an output port 426. As set forth in step 348 above, each driver buffer 424 must only drive a net that is external to the block. Thus, port 428 driven by block driver 430 violates this constraint because it is an input to block receiver 432. So, in this example port 428 may be buffered inserting an additional buffer (not shown) at buffers 430, 432 to drive port 428.

In steps 350 and 378, driver strength and net length are checked to verify that nets do not exceed crosstalk critical length (CL) using the above described loading guidelines, and as may be further specified in the corresponding technology files. Drivers may be replaced with more powerful drivers, if necessary, in response to this step.

In step 352, each block input port 434 is checked for a single receiver buffer 436. Input port 438 connected to two input receivers 440, 442 is an example of a violation of this constraint. In addition, each input port is checked to determine whether the fan out of the input port is a single receiver inside the block placed next to the port. Thus, in addition to violating the single receiver constraint of step 352, buffer 442 is too distant from input port 438 and so fails this constraint of step 354. Again, this may be corrected by inserting a buffer (not shown) between input port 438 and buffers 440, 442. Correspondingly, in step 356, each input buffer is checked to ensure that the buffer fanout is exclusively internal (i.e., all cells driven by the receiver are contained within the block). No external fanout is allowed for an input buffer. Thus, input buffer 444 is violative of this constraint.

In step 358, the distance between each port buffer (input receiver or output driver) and its corresponding port is checked to determine whether any is beyond a given length (LP) specified in the particular technology library. The total metal length between each physical port and a connected port buffer is constrained to be less than LP. Again, receiver 444 is violative of this constraint, because it is too far away from both ports 446 and 448. Thus, steps 346 through 358 are applied to a hierarchical design both for crosstalk avoidance and checking. Buffers inserted and properly placed into the block design facilitates crosstalk avoidance by placing boundaries on potential crosstalk sources. Thus, steps 346 through 358 verify that the blocks meet these constraints including insuring that buffers have adequate drive strength.

Figure 16:
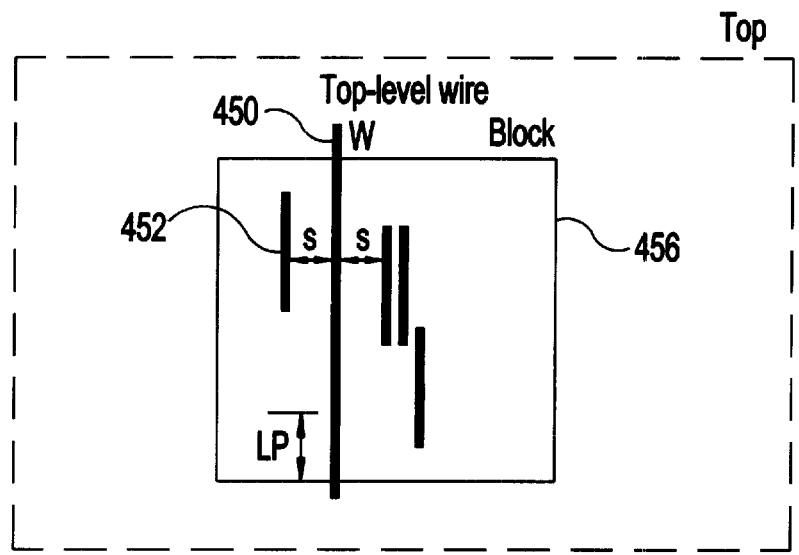
FIG. 16 shows blockages inserted around block wires.

Satisfaction of the constraints of each of steps 360 and 380, 382 can individually minimize crosstalk occurrences between top level wiring and block level wires in the same layer. If the design meets the constraints of steps 360, 380 and 382 crosstalk will not occur between block level nets and top level nets. Inter-layer crosstalk conditions are minimized such that crosstalk analysis may be carried out separately and independently at the top level and at the block level. So, as can be seen from FIG. 16, blockages are inserted around block wires in step 360. This ensures that a minimum distance is maintained between top level wires (passing through the block 456) and block level wires. Thus, in the example of FIG. 16, each top level wire 450 has at least a required S to block level wires 452, 454, if the top level wire exceeds the given threshold length LP. As noted above with respect to step 380, for very short runs of top level wires, i.e., those that are less than the threshold length LP, crosstalk that might occur in these wires is neglectable.

Figure 17:
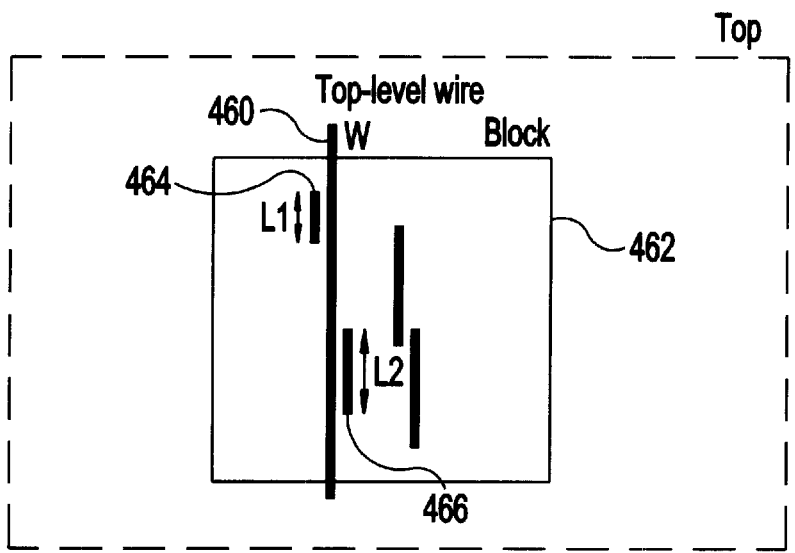
FIG. 17 shows an example of a top level wire passing through a block wherein the block level wires are coupled to a top level wire below the maximum coupling limit (LC)

FIG. 17 is an example of a top level wire 460 passing through a block 462 with wherein block level wires 464, 466 are coupled to top level wire 460 below maximum coupling limit (LC). As can be seen, the total coupling is equal to the total length of the adjacent block wires 464, 466, in this example L1+L2. Total coupling should always be such that L1+L2<LC. So, even for top level wires that exceed the crosstalk critical length LP and pass through a block without maintaining the maximum spacing with block level wires, crosstalk conditions do not exist if the coupling between the top level wire and any block level aggressor wires is limited to less than an above coupling threshold limit. So, as noted above steps 360, 380, 382 constrain top level wires that pass through each block both for crosstalk avoidance (e.g., blocking close passage to block level wires in step 360 of block level design major step 340) and check for crosstalk conditions (while ignoring short runs or runs with very little coupled signal steps 380, 382). As a result, any long top level wires that pass through any block are either spaced sufficiently from adjacent wires to avoid crosstalk, or only pass close to very short block level wire runs.

Figure 18:
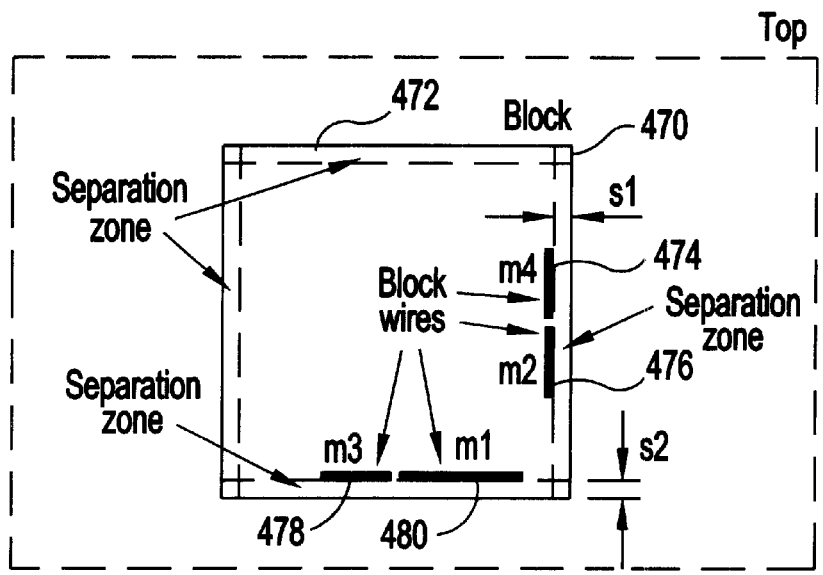
FIG. 18 shows an example of a step defining a crosstalk avoidance zone around each block.

As in the example of FIG. 18, step 362 defines a crosstalk avoidance zone around each block 470. The crosstalk avoidance zone 472 is formed by spacing a blockage around the perimeter of the block 470 to prevent top level wires routed by the block from passing close enough to periphery block wires for crosstalk to occur between these adjacent wires in the same layer. In particular, this crosstalk avoidance zone 472, or separation zone, may extend the block perimeter by a necessary crosstalk separation distance for the particular wiring direction, e.g., a first distance S1 in one direction and a second distance S2 in a second, orthogonal direction. Thus, in this example, block wires 474, 476, 478 and 480 are the outer most wires on two sides within the block 470. Wires 474 and 476 are in a first direction and wires 478 and 480 are in the second, orthogonal direction. For this example, wire 480 may be at a lowest metal layer and wire 474, may be at an uppermost wiring layer. Thus, the separation zone is narrower in the S1 spaced region than for wires at lower wiring layers. The separation zone assures that any global wiring passing by the block are separated from block wires by at least the minimum acceptable crosstalk avoidance distance for wires in that particular direction.

Figure 19:
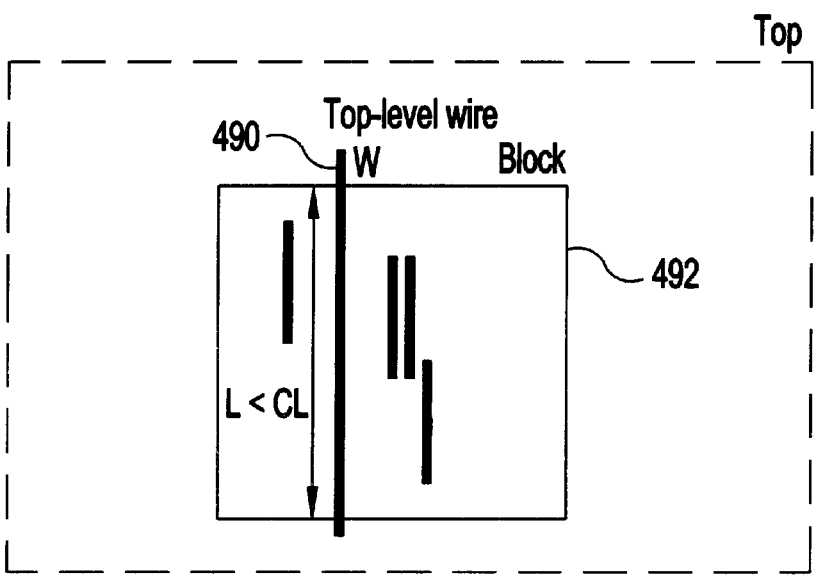
FIG. 19 shows an example of an acceptable top level wire passing through a block that exceeds the critical length (CL).

FIG. 19 shows an example of a top level wire 490 shorter than the critical length CL passing through block 492. In step 384 any top level wires that pass through blocks and that are longer than CL are identified. Any such wire 490 identified in step 384 is segmented and a buffer is inserted between wire segments as described hereinabove. The buffer (not shown) is inserted at the top level of the design and not inserted into any block, which at this point have been checked, locked and are unchangeable. Thus, as a result of this step 384 all top level wires are shorter than the critical length.

Finally, as described above in step 386 the top level design is checked for any wires that violated any of the foregoing constraints and in the step 388 any identified violations are repaired such that by design crosstalk cannot occur with a high degree of likelihood within the complete design. Thus, the need for timing level checking for crosstalk delays is obviated.

Thus, most crosstalk problems are avoided for hierarchical designs prior to and during block and top level wiring. Also, because of necessary physical design flexibility (and also possible manual wiring intervention), the design tool of the present invention applies both prospective design constraints to guide each design toward an optimum result, as well as subsequent rule checking to identify any remaining potential crosstalk sources and correct any such identified crosstalk sources. Thus, the design tool of the present invention avoids crosstalk in complex hierarchical designs, applying relatively simple wiring rules to constrain wiring, thereby avoiding the need for more complicated time consuming and expensive timing analysis on a flat design as is normally required.

Advantageously, potential crosstalk related problems are identified early, prior to wiring and, in particular, prior to initial or final placement, thereby avoiding potentially time consuming post design crosstalk analysis that may or may not lead to an acceptable design solution. Instead, a user knows within a selected level of confidence prior to placement that the finally placed and wired design will not have cross-talk problems or errors associated therewith.

While the invention has been described in terms of preferred embodiments, those skilled in the art will recognize that the invention can be practiced with modification within the spirit and scope of the appended claims.

What is claimed is:

1. A method of integrated circuit design, said method comprising the steps of:
   a) placing each block of an integrated circuit design;
   b) verifying whether said each block is well behaved;
   c) inserting blockages in said each block;
   d) routing top level wires to minimize crosstalk between top level wires and block level wires; and
   e) checking top level wiring for crosstalk sources.

2. A method as in claim 1 wherein the step (a) of placing said each block of an integrated circuit design comprises routing block level wiring, adjacent wiring layers being oriented orthogonally to each other.

3. A method as in claim 2 wherein the step (b) of verifying whether each block is well behaved comprises determining whether nets to internal block cells are internal nets, whether each input net to each block is connected to a single buffer, and whether each output buffer from said each block only drives external nets.

4. A method as in claim 2 wherein the step (b) of verifying whether said each block is well behaved comprises the steps of:
   i) identifying nets that are both external and internal, any identified net being a violation;
   ii) identifying underpowered output buffer, any identified buffer being a violation;
   iii) identifying port buffer beyond a maximum distance from a connected port, any identified said port buffer being a violation; and
   iv) fixing all violations.

5. A method as in claim 4 wherein the step (b)(i) of identifying nets identifies any nets in said each block with both connected internal cells and external cells, and fixing all violations comprises inserting a buffer in each identified said net between connected internal cells and connected external cells, whereby after fixing said all violations, all nets are either an internal net or an external net.

6. A method as in claim 4 wherein the step (b)(ii) of identifying underpowered output buffers identifies buffers driving external nets and having a load exceeding a preselected maximum loadand fixing all violations comprises increasing drive for each identified underpowered output buffer.

7. A method as in claim 4 wherein the step (b)(iii) of identifying port buffers identifies any port having a connected buffer beyond a maximum distance and fixing violations reduces said distance from identified ports to connected port buffers below said maximum distance.

8. A method as in claim 4 wherein the step (c) of inserting blockages comprises inserting blockages around block level wires in each said block, inserted said blockages spacing top level wiring a selected distance from said block level wires within said each block.

9. A method as in claim 8 wherein the step (c) of inserting blockages in each said block further comprises inserting blockages along block perimeters, wherein inserted said blockages space top level wires a selected distance from adjacent said block level wiring.

10. A method as in claim 9 wherein the step (d) of routing top level wires comprises the steps of:
   i) setting top level wiring layer orientation through each placed block; and
   ii) routing said top level wiring guided by said blockages, top level wiring passing through said each placed block on wiring layers substantially determined by said top level wiring layer orientation.

11. A method as in claim 10 wherein the step (e) of checking said top level wiring for crosstalk sources comprises the steps of:
   i) identifying any top level wire exceeding a critical length, any identified said top level wire being a violation;
   ii) identifying any parallel run of one said top level wire adjacent a block level wire wherein said parallel run exceeds crosstalk maximum length, any identified said parallel run being a violation; and
   iii) identifying any top level wire having a portion longer than said crosstalk maximum length through any of said blocks, any identified said portion being a violation.

12. A method as in claim 11 further comprising the step of:
   f) fixing all violations identified in step (e).

13. A method as in claim 12 wherein any top level wires identified in step (e)(i) are segmented in step (f), all top level wire segments being shorter than said critical length.

14. A method as in claim 12 wherein top level wires in parallel runs identified in step (e) (ii) are segmented in step (f), fixed said parallel runs containing top level line segments being shorter than said crosstalk maximum length.

15. A method as in claim 12 wherein said portions of top level wires identified in step (e) (iii) are segmented in step (f), segmented portions in blocks being shorter than said crosstalk maximum length.

16. A method as in claim 1 wherein step (a) includes identifying Tcone paths from a terminating register, calculating a crosstalk overhead for the terminating register, and adding the calculated crosstalk overhead to an SDF file.

17. A method as in claim 1 wherein step (c) includes inserting a blockage at a block level wire to minimize crosstalk between a through-wired top level wire passing a block level wire.

18. A method as in claim 1 wherein step (d) includes identifying a top level wire passing through a block and segmenting the top level wire to avoid exceeding a critical crosstalk length.

19. A circuit design system for designing hierarchically architected integrated circuits, said circuit design system comprising:
   means for placing and wiring an integrated circuit;
   means for verifying whether blocks of said integrated circuit are well behaved;
   means for selectively blocking areas of said blocks, subsequent wiring being presented between blocked areas; and
   means for identifying crosstalk sources in said subsequently routed wiring.

20. A circuit design system as in claim 19 further comprising:
   means for orienting block level wiring layers, adjacent block level wiring layers being oriented orthogonally to each other.

21. A design system as in claim 20, wherein placed block level wiring layer orientation orients subsequently wired wiring levels.

22. A circuit design system as in claim 21 wherein said means for selectively blocking comprises:
   means for spacing subsequently wired wires a selected distance from block level wiring.

23. A circuit design system as in claim 21 wherein said means for checking blocks comprises:
   means for identifying any nets connected to inputs to cells contained in one block and connected to inputs to cells external to said one block;
   means for identifying whether an output buffer is driving a load exceeding a maximum load for said output buffer; and
   means for identifying whether any port is spaced from a connected buffer by a distance exceeding a maximum distance.

24. A circuit design system as in claim 23 wherein said means for identifying crosstalk sources comprises:
   means for identifying any top level wires exceeding a critical length;
   means for identifying parallel runs of top level wires with block level wires exceeding a crosstalk maximum length;
   means for identifying any top level wires having a portion through a block exceeding said crosstalk maximum length; and
   means for segmenting identified top level wires.

25. A computer program product for designing integrated circuits, said computer program product comprising a computer usable medium having computer readable code thereon, said computer readable program code comprising:
   computer program code means for placing and wiring an integrated circuit;
   computer program code means for making circuit blocks well behaved;
   computer program code means for blocking areas of said blocks from subsequent wiring; and
   computer program code means for identifying crosstalk sources in top level wiring.

26. A computer program product as in claim 25 wherein the computer program code means for placing and wiring comprises:
   computer program code means for orienting adjacent wiring layers orthogonally to each other in said circuit blocks.

27. A computer program product as in claim 26 wherein said computer program code means for selectively blocking comprises:
   computer program code means for spacing top level wires a selected distance from block level wiring.

28. A computer program product code as in claim 27 wherein said computer program product code means for making circuit blocks well behaved comprises:
   computer program code means for identifying any nets connected to inputs to cells contained in one block and connected to inputs to cells contained in one block and connected to inputs to cells external to said one block;

computer program code means for identifying whether an output buffer is driving a load exceeding a maximum load for said output; and means for identifying any port is spaced from a connected buffer by a distance exceeding a maximum distance.

29. A computer program product as in claim 28 wherein said computer program code means for identifying crosstalk sources comprises:

computer program code means for identifying any top level wires exceeding a critical length;

computer program code means for identifying parallel runs of top level wires with block level wires exceeding a crosstalk maximum length;

computer program code means for identifying any top level wires having a portion through a block exceeding said crosstalk maximum length; and computer program code means for segmenting identified top level wires.

* * * * *